United States Patent
Mayor et al.

(10) Patent No.: US 7,891,103 B2
(45) Date of Patent: Feb. 22, 2011

(54) MAGNETOMETER ACCURACY AND USE

(75) Inventors: Robert Mayor, Half Moon Bay, CA (US); Patrick Piemonte, San Francisco, CA (US); Ronald Keryuan Huang, Milpitas, CA (US); Parin Patel, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 9 days.

(21) Appl. No.: 12/479,717

(22) Filed: Jun. 5, 2009

(65) Prior Publication Data

US 2010/0307016 A1    Dec. 9, 2010

(51) Int. Cl.
*G01C 17/38* (2006.01)
(52) U.S. Cl. ......................................................... 33/356
(58) Field of Classification Search ..................... 33/356
See application file for complete search history.

(56) References Cited

U.S. PATENT DOCUMENTS

| | | | |
|---|---|---|---|
| 5,761,094 A | 6/1998 | Olson et al. | |
| 5,946,813 A | 9/1999 | Nachbaur et al. | |
| 6,311,129 B1 | 10/2001 | Lin | |
| 6,408,245 B1 | 6/2002 | An et al. | |
| 6,424,914 B1 | 7/2002 | Lin | |
| 6,508,316 B2 | 1/2003 | Estes et al. | |
| 6,539,639 B2 | 4/2003 | Smith | |
| 6,622,091 B2 | 9/2003 | Perlmutter et al. | |
| 6,651,003 B2 | 11/2003 | Woloszyk et al. | |
| 6,768,452 B2 | 7/2004 | Gilkes | |
| 6,807,485 B1 | 10/2004 | Green | |

(Continued)

FOREIGN PATENT DOCUMENTS

WO    WO 2008/0122904        10/2008

(Continued)

OTHER PUBLICATIONS

Honeywell 3-Axis Digital Compass IC, HMC5843 Electronic Compass, Honeywell International Inc. [online]; retrieved from the Internet: <URL: http:http://www.honeywell.com/sites/portal?smap=aerospace&page=Magnetic-Sensors3&theme=T15&catID=CF4B17AB-A90F-716D-10BC-A1E75441138E&id=HF916B4E0-4F71-9DB5-DFA8-51B1944918EE&sel=2&se14=1>, retrieved on Jun. 5, 2005, 1 page.

(Continued)

*Primary Examiner*—Christopher W Fulton
(74) *Attorney, Agent, or Firm*—Fish & Richardson P.C.

(57) ABSTRACT

A parameter related to the Earth's magnetic field can be used to determine accuracy of a magnetometer of a mobile device. In one aspect, a first instance of a parameter related to Earth's magnetic field is determined using data generated by the magnetometer. The magnetometer data can be based in part on a position of the mobile device with respect to the Earth. A second instance of the parameter can be determined using data generated by a model of Earth's magnetic field. The model data can also be based in part on the position of the mobile device with respect to the Earth. The first instance of the parameter can be compared with the second instance of the parameter. An accuracy metric for the magnetometer can be determined based on a result of the comparison. An indication of the accuracy metric can be presented by the mobile device.

26 Claims, 5 Drawing Sheets

U.S. PATENT DOCUMENTS

| | | | |
|---|---|---|---|
| 6,964,107 B1 * | 11/2005 | Ahola | 33/356 |
| 6,988,049 B1 | 1/2006 | Wirtz et al. | |
| 7,196,660 B2 | 3/2007 | Abraham | |
| 7,210,236 B2 | 5/2007 | Sato et al. | |
| 7,248,983 B2 | 7/2007 | Fillatreau et al. | |
| 7,275,008 B2 | 9/2007 | Plyvanainen | |
| 7,391,366 B2 | 6/2008 | Park et al. | |
| 7,451,549 B1 | 11/2008 | Sodhi et al. | |
| 7,458,166 B2 | 12/2008 | Parks et al. | |
| 7,548,200 B2 | 6/2009 | Garin | |
| 7,565,839 B2 | 7/2009 | Stewart et al. | |
| 7,631,119 B2 | 12/2009 | Moore | |
| 2003/0135327 A1 | 7/2003 | Levine et al. | |
| 2005/0223575 A1 | 10/2005 | Fillatreau et al. | |
| 2005/0240347 A1 | 10/2005 | Yang | |
| 2006/0190174 A1 | 8/2006 | Li et al. | |
| 2006/0195254 A1 | 8/2006 | Ladetto et al. | |
| 2008/0066331 A1 | 3/2008 | Brzezinski et al. | |
| 2008/0201096 A1 | 8/2008 | Wright et al. | |
| 2009/0033807 A1 | 2/2009 | Sheng et al. | |
| 2009/0054075 A1 | 2/2009 | Boejer | |
| 2009/0070058 A1 | 3/2009 | Lin | |
| 2009/0089001 A1 | 4/2009 | Lin | |
| 2009/0171607 A1 | 7/2009 | Chen et al. | |
| 2009/0326851 A1 | 12/2009 | Tanenhaus | |
| 2010/0121599 A1 | 5/2010 | Boeve et al. | |

FOREIGN PATENT DOCUMENTS

| | | |
|---|---|---|
| WO | WO 2009/68116 | 6/2009 |

OTHER PUBLICATIONS

PNI Sensor Corporation, "Application Note: Calibration Computations for Practical Compassing using the PNI-11096 Magnetometer ASIC," Doc # 1000006, Aug. 2008, 3 pages.

Westerberg, Tommy, 'Compass Go', Apple Apps Store, Oct. 10, 2008, 3 pages.

Seong Yun Cho et al., "A Calibration Technique for a Two-Axis Magnetic Compass in Telematics Devices", Jun. 2005, ETRI Journal, vol. 27, No. 3, pp. 280-288.

Chris M. Goulet, "Magenetic Declination, Frequently Asked Questions", Oct. 2001, Version 4.4, [Online] [Retrieved on May 16, 2009]. Retrieved from the Internet: URL: http://www.geocities.com/magnetic_declination/, 16 pages.

PNI Sensor Corporation, "Calibration Computations for Practical Compassing using the PNI-11096 Magnetometer ASIC", Aug. 2008, PNI Corporation ©2001, Santa Rosa, CA, 3 pages.

PNI Sensor Corporation, "Multipoint Calibration Primer", (no publication date available), PNI Corporation, Santa Rosa, CA, 10 pages.

An Overview of the Earth's Magnetic Field, "The Earth's Magnetic Field—An Overview", [Online] [Retrieved on May 16, 2009]. Retrieved from the Internet: URL: http://www.geomag.bgs.ac.uk/earthmag.html, 10 pages.

The Earth's magnetic field, EPS 122: Lecture 5—Earth's magnetic field, 11 pages.

Apptism, iTopoMaps, ©2009 Apptism, [Online] [Retrieved on Jun. 2, 2009]. Retrieved from the Internet: URL: http://www.apptism.com/apps/itopomaps, 4 pages.

Apptism, Compass Go, ©2009 Apptism, [Online] [Retrieved on Jun. 3, 2009]. Retrieved from the Internet: URL: http://www.apptism.com/apps/compass-go, 2 pages.

Apptism, Focalware, ©2009 Apptism, [Online] [Retrieved on Jun. 3, 2009]. Retrieved from the Internet: URL: http://www.apptism.com/apps/focalware, 2 pages.

Huang et al., "Automatically Identifying Geographic Direction", U.S. Appl. No. 12/477,865, filed Jun. 3, 2009.

Mayor et al., "Restoring and Storing Magnetometer Calibration Data", U.S. Appl. No. 12/479,483, filed Jun. 5, 2009.

Mayor et al., "Context Determination to Assist Location Determination Accuracy", U.S. Appl. No. 12/549,250, filed Aug. 27, 2009.

Piemonte, et al., "Dynamic Compass Calibration in a Portable Device", U.S. Appl. No. 12/479,203, filed Jun. 5, 2009.

Mayor et al., "Accuracy Indications for an Electronic Compass in a Portable Device", U.S. Appl. No. 12/479,196, filed Jun. 5, 2009.

Harper et al., "Process for Improving GPS acquisition assistance data and server-side location determination for cellular networks," 2004 Intl Symp on GNSS/GPS, Dec. 6-8, 2004, Sydney, Australia, 15 pages.

Adiprawita et al., "Development of AHRS (Attitude and Heading Reference System) for Autonomous UAV (Unmanned Aerial Vehicle)," *Proc Int'l Conf on Electrical Engineering and Informatics*, Institut Teknologi Bandung, Indonesia, Jun. 17-19, 2004, 4 pages.

Zhang and Gao, "A Novel Auto-calibration Method of the Vector Magnetometer," *Ninth Intl Conf on Electronic Measurement & Instruments*, ICEMI '2009, pp. 1-145 through 1-150.

Camps et al., "Numerical Calibration for 3-Axis Accelerometers and Magnetomors," *IEEE*, 2009, pp. 217-231.

Moore et al., "Calibrating Sensor Measurements on Mobile Devices," U.S. Appl. No. 12/886,494, filed Sep. 20, 2010.

Piemonte et al., "Determining Heading Using Magnetometer Data and angular Rate Data", U.S. Appl. No. 12/886,531, filed Sep. 20, 2010.

Tu, "Magnetometer Calibration," U.S. Appl. No. 12/899,392, filed Oct. 6, 2010.

* cited by examiner

MAGNETOMETER ACCURACY AND USE

TECHNICAL FIELD

This subject matter is related generally to magnetometers.

BACKGROUND

A mobile device such as a cellular phone or a smart phone, PDA, handheld computer, navigational device, gaming device, netbook, among others can be equipped with a magnetometer. Magnetometer readings can be used to provide its user with a direction, which may be a "heading" (typically given relative to the Earth's true North), and/or an arrow pointing to true North. The direction information may be provided for the user's own navigation knowledge, for example, to tell the user which way is north while the user is walking or driving in unfamiliar surroundings. The direction information can also be used by a navigation or map application that may be running on the mobile device.

The magnetometer obtains a measure of the magnetic field that is present in the immediate surroundings of the mobile device as a two or three-component vector in a Cartesian coordinate system using 2-axis or 3-axis magnetic sensors. The sensed magnetic field can contain a contribution of the Earth's magnetic field and a contribution by a local interference field (interference field co-located with the mobile device). The latter is a magnetic field that is created by field sources in the local environment of the mobile device. This may include contributions made by one or more magnetic components that are near the magnetic sensors, such as the magnet of a loudspeaker that is built into the mobile device. The interference field may also have a contribution due to one or more magnetic objects found in the external environment close to the device, such as when the user is driving an automobile, riding in a train or bus, or riding on a bicycle or motorcycle. In most cases, the interference field is not negligible relative to the Earth's magnetic field. Therefore, a calibration procedure is needed to reduce the adverse impact of the interference field contribution from the sensors' measurements to allow the magnetometer to calculate a more accurate direction.

There are several types of 3-axis calibration procedures. In one such technique, the user is instructed to rotate the mobile device (containing the magnetometer) according to a set of geometrically different orientations and azimuth angles, while measurements by the magnetometer and by an orientation sensor are collected and analyzed to isolate or quantify the interference field. The quantified interference field can then be subtracted from the measurement taken by the magnetic sensor to yield the Earth's geomagnetic field. The Earth's geomagnetic field can be further corrected to get the true north direction, such as correcting for magnetic variation (declination) due to the variation of the Earth's magnetic field based on geographic location.

In another 3-axis calibration technique, rather than instruct the user to deliberately rotate the mobile device in a predetermined manner, measurements are collected from the magnetometer, continuously over a period of time, while the mobile device is being used or carried by the user. This can lead to random (albeit sufficient) rotations of the mobile device, such that the magnetometer measurements define a desired, generally spherical measurement space. The sphere is offset from the origin of a coordinate system for the Earth's geomagnetic field vector by an unknown offset vector, which can represent a substantial part (if not all) of the interference field. Mathematical processing of the measurements can be performed to "re-center" the sphere by determining the offset vector. This technique is transparent to the user because the user is not required to go through a calibration procedure where the user deliberately rotates the device through a specified set of orientations.

SUMMARY

A parameter related to the Earth's magnetic field can be used to determine accuracy of a magnetometer of a mobile device. In one aspect, a first instance of a parameter related to Earth's magnetic field is determined using data generated by the magnetometer. The magnetometer data can be based in part on a position of the mobile device with respect to the Earth. A second instance of the parameter can be determined using data generated by a model of Earth's magnetic field. The model data can also be based in part on the position of the mobile device with respect to the Earth. The first instance of the parameter can be compared with the second instance of the parameter. An accuracy metric for the magnetometer can be determined based on a result of the comparison. An indication of the accuracy metric can be presented by the mobile device.

DETAILED DESCRIPTION

The Earth's Magnetic Field—Overview

Figure 1A:
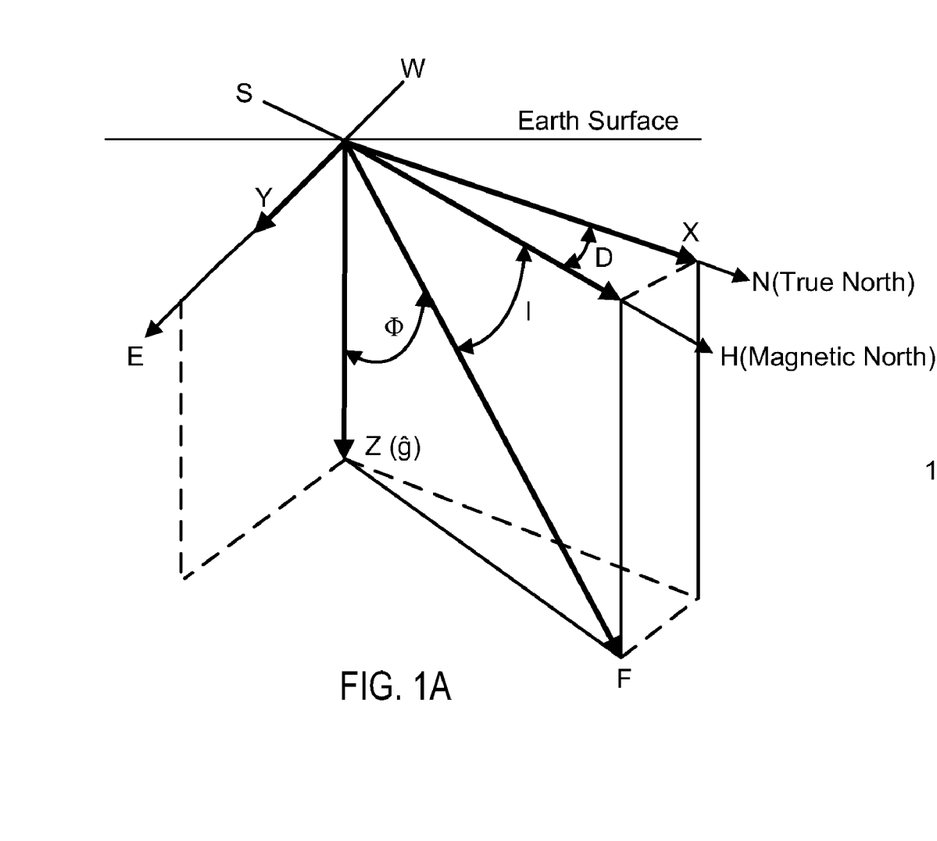
FIG. 1A illustrates an exemplary Cartesian coordinate system describing the Earth's geomagnetic field in accordance with some implementations.

FIG. 1 illustrates an exemplary Cartesian coordinate system for describing the Earth's geomagnetic field in accordance with some implementations. The Earth's geomagnetic field vector, F, can be described by the orthogonal components X (northerly intensity), Y (easterly intensity) and Z (vertical intensity, positive downwards); total intensity F; horizontal intensity H; inclination (or dip) I, and declination (or magnetic variation) D. Declination, inclination and total intensity can be computed from the orthogonal components using the equations $$D = \arctan\left(\frac{Y}{X}\right), \quad (1)$$

$$I = \arctan\left(\frac{Z}{H}\right), \quad (2)$$

$$F = \sqrt{H^2 + Z^2}, \text{ and} \quad (3)$$

where H is given by $$H=\sqrt{X^2+Y^2}. \quad (4)$$

An angle Φ can be defined as the angle between the geomagnetic field vector, $\vec{F}$, and the Earth's gravitational acceleration vector $\hat{g}$ (which is aligned with the Z component of the Earth's geomagnetic field vector). The angle Φ can be determined from the inclination angle I, or Φ=90°−I. At any given position on Earth, the total intensity F is constant, regardless of magnetometer orientation. Also, at any given position on Earth, the angle Φ is constant, regardless of magnetometer orientation. The International System of Units (SI) unit of magnetic field intensity most commonly used is the Tesla.

Figure 1B:
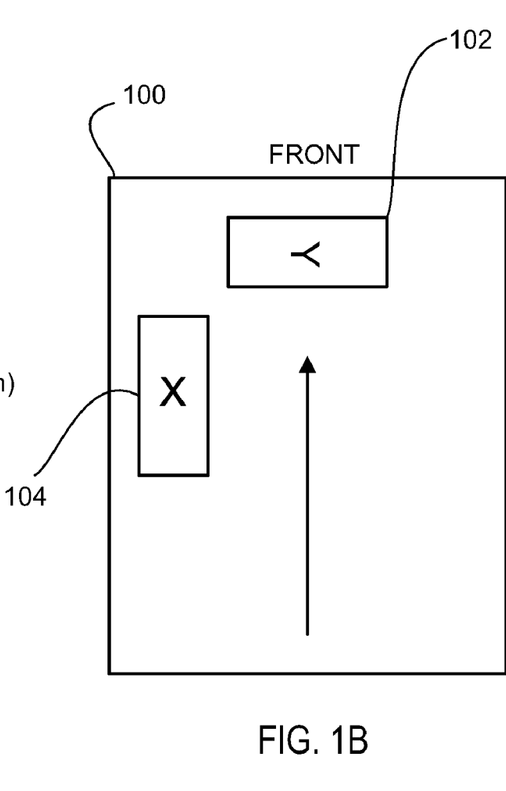
FIG. 1B illustrates an exemplary 2-axis magnetometer in accordance with some implementations.

FIG. 1B illustrates an exemplary 2-axis magnetometer in accordance with some implementations. Magnetometers can be 2-axis or 3-axis and the processes described here apply to both types of sensors. In the interest of brevity, only a 2-axis magnetometer is described.

In some implementations, 2-axis magnetometer sensor configuration 100 can be used to calculate a heading for a variety of applications, including applications running on a mobile device. Sensor configuration 100 can include two magnetic field sensors 102, 104 mounted orthogonally on a board, substrate or other mounting surface. Magnetic sensors 120, 104 can be included in an integrated circuit (IC) package with or without other sensors, such as accelerometers and gyros.

Sensor configuration 100 can be deployed in a host system environment that contains interfering magnetic fields. Since the Earth's magnetic field is a weak field (~0.5 Gauss), nearby magnetic objects can interfere with the accurate measurements of sensors 102, 104. A calibration procedure can be deployed to isolate and remove the local magnetic interference. One technique is to determine offsets or offset vector which can be subtracted from sensor measurements to get accurate measurements of the Earth's magnetic field. For 3-axis sensors, a third component, Z, can be adjusted with an offset as well.

In one exemplary calibration procedure for a 2-axis magnetometer, each heading computation can be assumed to be made with a number of valid X and Y sensor readings which can be taken with a minimal delay between each reading. For this exemplary sensor configuration, sensors 102, 104 are at right angles with respect to each other and lie level with respect to the Earth's surface. By convention, the positive end of the X-axis points to the North and the positive end of the Y-axis points to the East. For this example, two consecutive sensor readings are made 180 degrees apart during calibration. These measurement pairs can be represented by (X1, Y1) and (X2, Y2). The Earth's magnetic field in any given direction, as measured with no interfering field can be represented by offset pair $(X_E, Y_E)$. Magnetic interference can be represented by $(X_{offset}, Y_{offset})$. Using these mathematical conventions, the two sensor readings can be represented by $$X1=X_E+X_{offset};$$

$$Y1=Y_E+Y_{offset};$$

$$X2=-X_E+X_{offset}; \text{ and}$$

$$Y2=-Y_E+Y_{offset}. \quad (5)$$

Assuming the magnetometer is fixed with respect to the host system (e.g., a magnetometer installed in a mobile phone), the readings (X1, Y1) and (X2, Y2) taken during calibration will both contain the same interference values $(X_{offset}, Y_{offset})$. Since the magnetometer readings taken during calibration are 180 degrees apart the readings are equal but opposite in sign. Solving the equations above for $X_{offset}$ and $Y_{offset}$ yields $$X_{offset}=(X1+X2)/2, \text{ and}$$

$$Y_{offset}=(Y1+Y2)/2. \quad (6)$$

A measurement of the sensor readings can be represented by $(X_E, Y_E)$. In some implementations, a basic calculation of the heading can be performed using $X_E$ and $Y_E$ and the equation:

$$A_{heading}=\arctan(Y_E, X_E), \quad (7)$$

where the resulting heading $A_{heading}$ can be mapped into the correct quadrant based on the signs of $X_E$ and $Y_E$. The heading $A_{heading}$, calculated from measurements provided by the magnetometer, is a magnetic heading that can be corrected by combining the declination with the heading $A_{heading}$ to identify a heading relative to true north.

Other implementations are possible. For example, the heading can also be calibrated based on the orientation of the device obtained from an accelerometer, inclination, and other types of corrections or calibrations.

Once the offsets are determined, the offsets can be subtracted from a subsequent sensor reading (X3, Y3).

$$X_E=X3-X_{offset},$$

$$Y_E=Y3-Y_{offset}. \quad (8)$$

Some additional techniques for performing 2-dimensional and 3-dimensional electronic magnetometer calibration are described in co-pending patent application Ser. No. 12/479,182, filed Jun. 5, 2009, for "Calibration Techniques For An Electronic Compass In A Portable Device," which is incorporated by reference herein in its entirety.

If a magnetometer is included in a mobile device, such as a mobile phone, the local magnetic interference can change. For example, if the user docks his mobile device (containing the magnetometer) in his car, magnetic objects in the car could change the local interference. This could result in the calibration offsets becoming invalid. If the offsets are invalid, then the magnetometer can perform a recalibration procedure to generate new offsets. This recalibration procedure can be a tedious process for the user if performed often, and may require the user to manipulate the mobile device through a number of angles.

Example Calibration System

Figure 2:
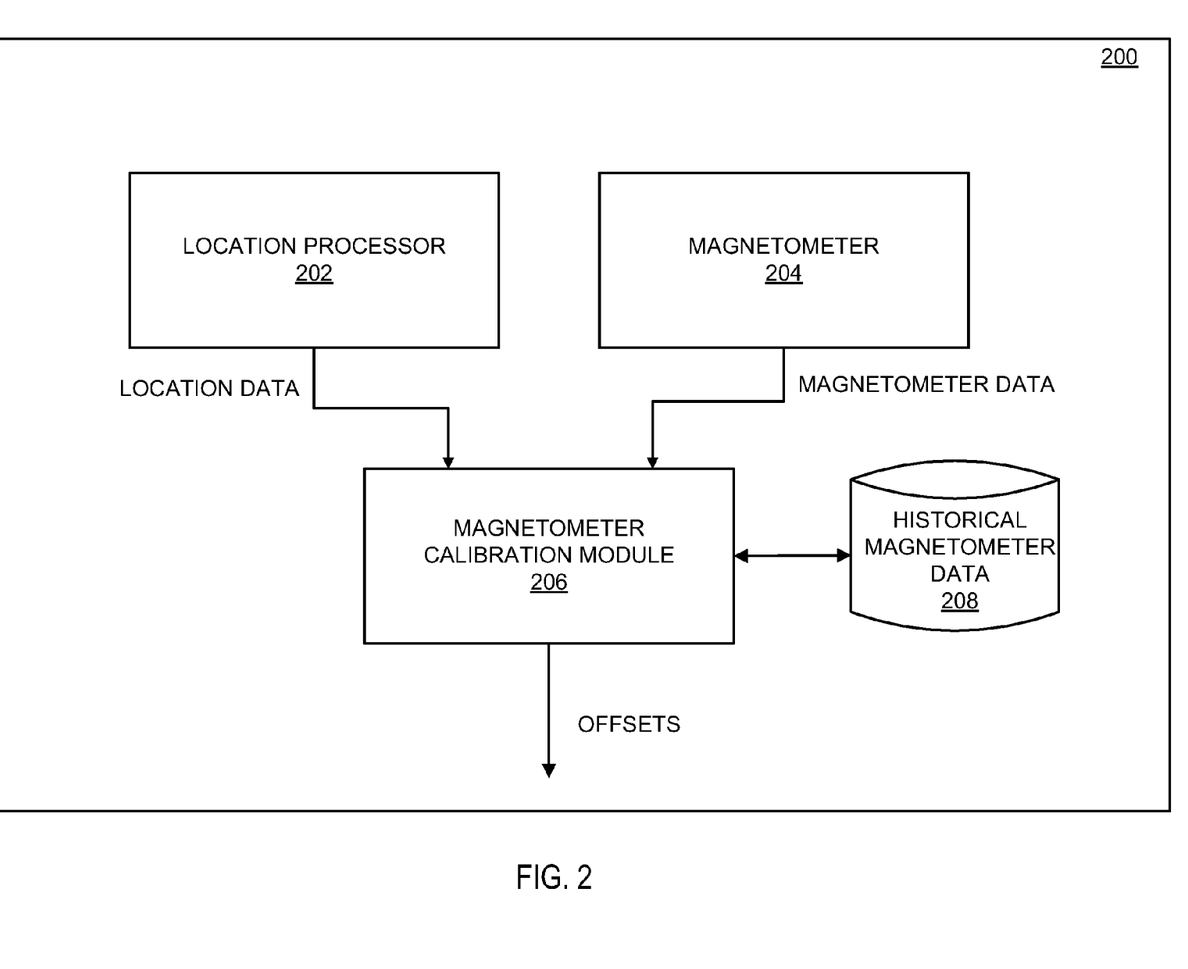
FIG. 2 is a block diagram of exemplary calibration system in accordance with some implementations.

FIG. 2 is a block diagram of an exemplary calibration system 200 in accordance with some implementations. Calibration system 200 can include location processor 202, magnetometer 204, magnetometer calibration module 206 and historical magnetometer data 208. Calibration system 200 can be implemented in software, firmware, hardware or a combination thereof. Location processor 202 can be a GPS receiver or some other processor or receiver for implementing cell tower positioning technology or a Wi-Fi positioning technology (e.g., Skyhook™). Magnetometer 204 can be a 2-axis or 3-axis magnetometer sensor. Magnetometer calibration module 206 can be software that receives position data and magnetometer data from location processor 202 and magnetometer 204, respectively.

In some implementations, calibration system 200 can respond to a recalibration trigger event. A recalibration trigger event can be any event that triggers a recalibration procedure on the mobile device. The trigger event can be based on time, location, mobile device activity, an application request, magnetometer data, etc. Responsive to the recalibration trigger event, location processor 202 can determine a current position of the mobile device. The position information can provide various parameters related to the Earth's magnetic field, which can be used with an Earth geomagnetic field model to recalibrate the magnetometer. For example, declination D, inclination I, and total intensity, F, can be determined from the position information. The angle $\Phi$ can be determined from the inclination, I, or the dot product of F and the gravitational vector, $\hat{g}$, which can be received from location processor 202 and/or taken from an accelerometer reading. Once these parameters are determined, one or more of the parameters (collectively referred to as "historical magnetometer data") can be stored in a look up table or other repository for subsequent search and retrieval.

Example Process For Determining Magnetometer Accuracy

Figure 3:
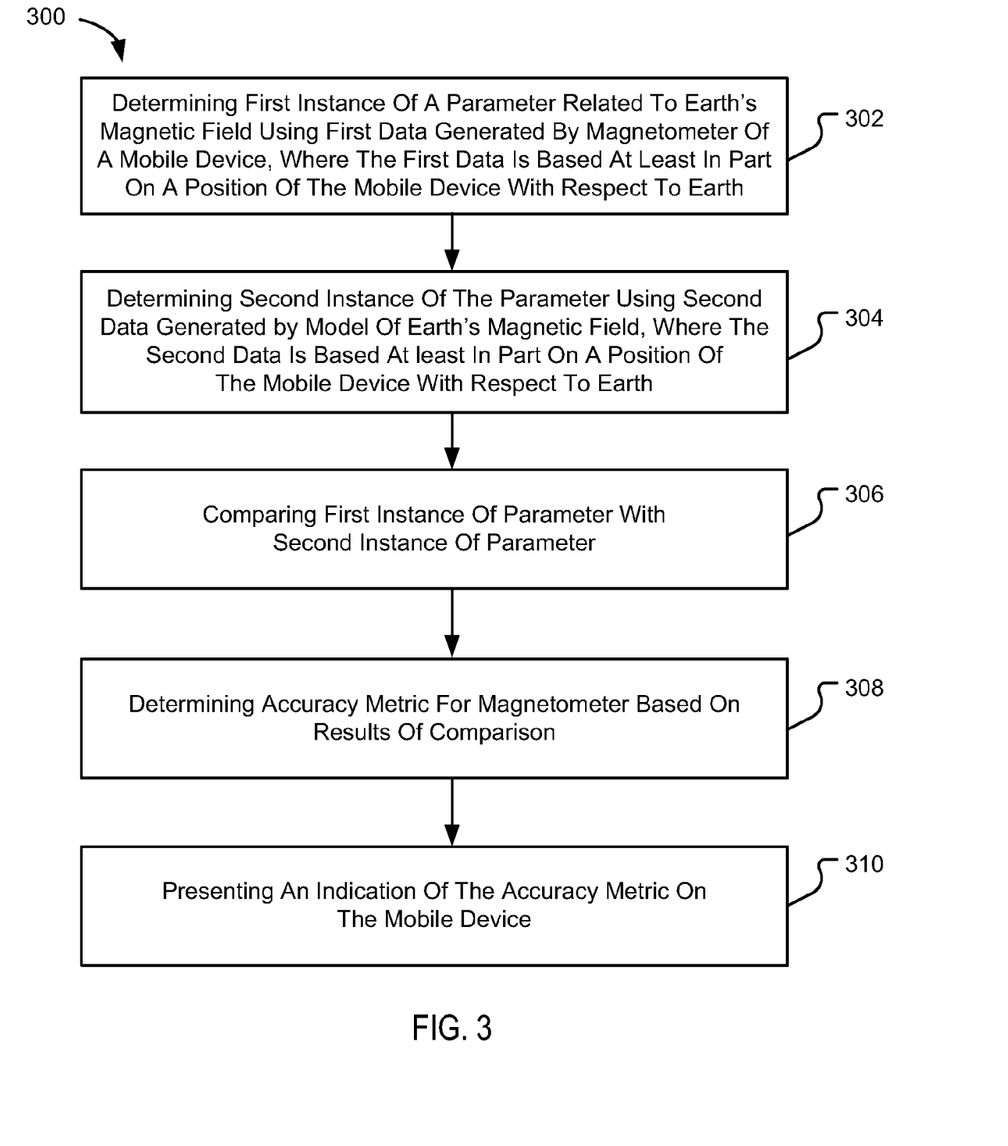
FIG. 3 is a flow diagram of an exemplary process for determining magnetometer accuracy in accordance with some implementations.

FIG. 3 is a flow diagram of an exemplary process 300 for determining magnetometer accuracy in accordance with some implementations. In some implementations, process 300 begins by determining a first instance of a parameter related to Earth's magnetic field using first data generated by a magnetometer of the mobile device. The first data can be based at least in part on a position of the mobile device with respect to the Earth (302). For example, a number of samples of the angle $\Phi$ can be calculated using magnetometer data and the Earth's magnetic vector, F, can be determined from X, Y, Z sensor readings, as described in reference to FIG. 2. The dot product of the Earth's magnetic vector, F, and the gravitational vector, $\hat{g}$, yields the angle $\Phi$. A second instance of the parameter can be determined using second data generated by a model of the Earth's geomagnetic field. The second data can be based at least in part on a position of the mobile device with respect to the Earth (304). For example, based on the position of the magnetometer with respect to the Earth, the geomagnetic field model can be used to generate inclination angle, I'. Then $\Phi'=90°-I$.

The first instance and the second instance can be compared (306). For example, a variation can be computed between sample angles $\Phi$ and model angles $\Phi'$ computed from a model of the Earth's geomagnetic field (e.g., $10^{th}$ Generation IGRF model). A running average of the variation can be determined from a set of N samples (e.g., N=10 samples), where N is a positive integer, as follows:

$$var_{ave} = \frac{1}{N}\sum_{n=0}^{N}(\Phi - \Phi')^2. \tag{9}$$

If a 2-axis magnetometer is used, then $\Phi$ can be a fixed horizontal projection to the 2-axis plane given by $H_{fixed}=F\cos(I)$.

An accuracy metric can be determined for the magnetometer based on results of the comparison (308). For example, a queue or other data structure can be used to store the maximum variation, $var_{max}$ over a given window of time. In this example, $var_{max}$ is the maximum value of $var_{ave}$ observed over M samples (e.g., M=30 samples). An approximate standard deviation value can be determined using the formula $$val = \frac{\sqrt{var_{max}}}{\sqrt{var_{ave}} * f_{scale}}, \tag{10}$$

where $f_{scale}$ is a scaling factor for moving the approximate standard deviation value calculated in equation (10) into one of a number of accuracy level "buckets" based on $\Phi$. In equation (10), the maximum average variance, $var_{max}$, is divided by the average variance to approximate a standard deviation value. In equation (10), $f_{scale}=2.0/\cos(\Phi')$.

In some implementations, the approximate standard deviation value can be placed in the following accuracy level "buckets":

If val<Best, then accuracy=10°;

If val<Level5, then accuracy=15°;

If val<Level4, then accuracy=20°;

If val<Level3, then accuracy=25°;

If val<Level2, then accuracy=30°;

If val<Level1, then accuracy=35°; and

If val<Worst, then accuracy=40°. (11)

Some exemplary accuracy levels for delineating the "buckets" can be: Best=15, Level1=90, Level2=75, Level3=60, Level4=45, Level5=30 and Worst=100.

The "accuracy" metric resulting from equations (11) can be used to generate an accuracy indicator for presentation on the mobile device (310). For example, a user interface displayed on the mobile device can present a graphical indicator that describes the accuracy of the magnetometer. An exemplary accuracy indicator is the heading error indicator described in reference to FIGS. 5A and 5B.

The accuracy calculation described above can be represented with the following pseudocode.

```
//the compass accuracy class is instantiated with the following geomagnetic information and parameters //10 and 30 are buffer sizes selected for this example //geomagneticModel, is an instance of the model that calculates all the static truth geomagnetic information fo the location of the device init(geomagneticModel.inclination,(2.0f/cos(CLCommonDegreesToRadians(geomagneticModel.inclination))), 10,30)

//within the accuracy component there is a function to handle the addition of calculated inclination values from the chip // raw magnetic data is read and the inclination is then calculated . . . then passed here void accuracy::addSample(float sample){

// calculate the variance of the sample from the model float varSam=sample-geomagneticModel.inclination;

varSam*=varSam;

// add the samples to two running instances fVaroamce.addSample(varSam); // this keeps a running average of 10 samples
``` fMaxQueue.addSample(fVariance.getValue( )); // this keeps the running maximum value of 30 samples

}

// when the heading is ready to be reported outside of this class, the accuracy value is collected from here float accuracy::getAccuracy( ){ float accuracy=40.0f; // default to the worst accuracy value

// compute the relative accuracy and scale appropriately

// value=(max^2/average^2)*scale float val=(sqrt(fMaxQueue.getValue( ))/sqrt(fVariance.getSize( ))*fScale);

// bucket the value by our accuracy settings if (val<kCompassAccuracyBest){ accuracy=10.0f;

} else if (val<kCompassAccuracyLevel5){ accuracy=20.0f;

} else if (val<kCompassAccuracyLevel3){ accuracy=25.0f;

} else if (val<kCompassAccuracyLevel2) { accuracy=30.0f;

} else if (val<kCompassAccuracyLevel1) { accuracy=35.0f;

} else if (val<kCompassAccuracyWorst) { accuracy=40.0f;

}

// return the accuracy value to be reported to the user return accuracy;

}

Example Mobile Device Architecture

Figure 4:
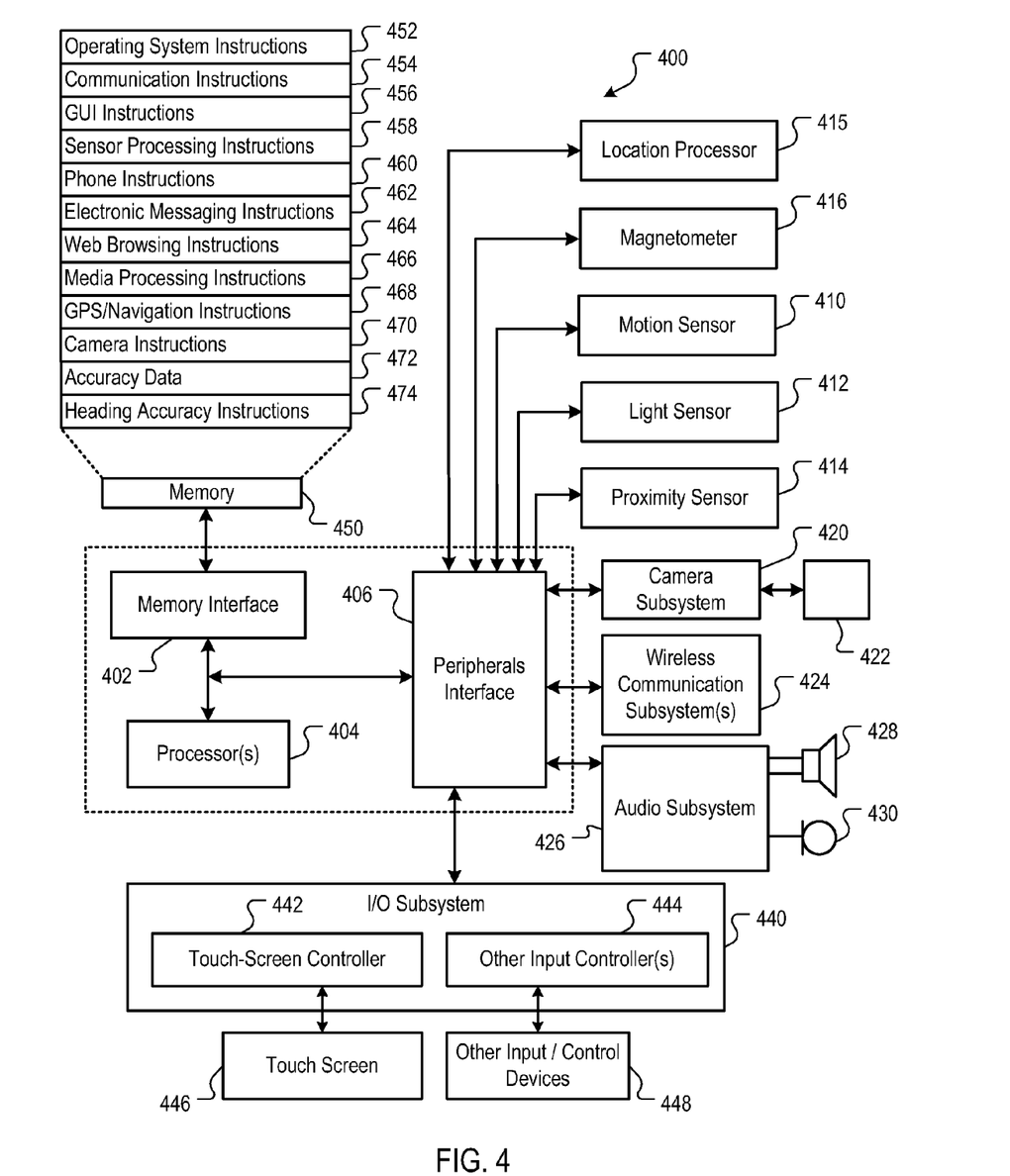
FIG. 4 is a block diagram of exemplary architecture of a mobile device employing the process of FIG. 3 in accordance with some implementations.

FIG. 4 is a block diagram of exemplary architecture 400 of a mobile device including a magnetometer. The mobile device 100 can include memory interface 402, one or more data processors, image processors and/or central processing units 404, and peripherals interface 406. Memory interface 402, one or more processors 404 and/or peripherals interface 406 can be separate components or can be integrated in one or more integrated circuits. Various components in mobile device architecture 400 can be coupled together by one or more communication buses or signal lines.

Sensors, devices, and subsystems can be coupled to peripherals interface 406 to facilitate multiple functionalities. For example, motion sensor 410, light sensor 412, and proximity sensor 414 can be coupled to peripherals interface 406 to facilitate orientation, lighting, and proximity functions of the mobile device. Location processor 415 (e.g., GPS receiver) can be connected to peripherals interface 406 to provide geopositioning. Magnetometer 416 (e.g., an integrated circuit chip) can also be connected to peripherals interface 406 to provide data that can be used to determine the direction of magnetic North.

Camera subsystem 420 and Optical sensor 422, e.g., a charged coupled device (CCD) or a complementary metal-oxide semiconductor (CMOS) optical sensor, can be utilized to facilitate camera functions, such as recording photographs and video clips.

Communication functions can be facilitated through one or more wireless communication subsystems 424, which can include radio frequency receivers and transmitters and/or optical (e.g., infrared) receivers and transmitters. The specific design and implementation of communication subsystem 424 can depend on the communication network(s) over which the mobile device is intended to operate. For example, the mobile device may include communication subsystems 424 designed to operate over a GSM network, a GPRS network, an EDGE network, a Wi-Fi or WiMax network, and a Bluetooth™ network. In particular, wireless communication subsystems 424 may include hosting protocols such that the mobile device may be configured as a base station for other wireless devices.

Audio subsystem 426 can be coupled to speaker 428 and microphone 430 to facilitate voice-enabled functions, such as voice recognition, voice replication, digital recording, and telephony functions. Note that speaker 428 could introduce magnetic interference to the magnetometer, as described in reference to FIGS. 1-2.

I/O subsystem 440 can include touch screen controller 442 and/or other input controller(s) 444. Touch-screen controller 442 can be coupled to touch screen 446. Touch screen 446 and touch screen controller 442 can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with touch screen 446.

Other input controller(s) 444 can be coupled to other input/control devices 448, such as one or more buttons, rocker switches, thumb-wheel, infrared port, USB port, docking station and/or a pointer device such as a stylus. The one or more buttons (not shown) can include an up/down button for volume control of speaker 428 and/or microphone 430.

In one implementation, a pressing of the button for a first duration may disengage a lock of touch screen 446; and a pressing of the button for a second duration that is longer than the first duration may turn power to the mobile device on or off. The user may be able to customize a functionality of one or more of the buttons. Touch screen 446 can, for example, also be used to implement virtual or soft buttons and/or a keyboard.

In some implementations, the mobile device can present recorded audio and/or video files, such as MP3, AAC, and MPEG files. In some implementations, the mobile device can include the functionality of an MP3 player, such as an iPod Touch™.

Memory interface 402 can be coupled to memory 450. Memory 450 can include high-speed random access memory and/or non-volatile memory, such as one or more magnetic disk storage devices, one or more optical storage devices, and/or flash memory (e.g., NAND, NOR). Memory 450 can store operating system 452, such as Darwin, RTXC, LINUX, UNIX, OS X, WINDOWS, or an embedded operating system such as VxWorks. Operating system 452 may include instructions for handling basic system services and for performing hardware dependent tasks. In some implementations, operating system 452 can be a kernel (e.g., UNIX kernel).

Memory 450 may also store communication instructions 454 to facilitate communicating with one or more additional devices, one or more computers and/or one or more servers. Memory 450 may include graphical user interface instructions 456 to facilitate graphic user interface processing; sensor processing instructions 458 to facilitate sensor-related processing and functions; phone instructions 460 to facilitate phone-related processes and functions; electronic messaging instructions 462 to facilitate electronic-messaging related processes and functions; web browsing instructions 464 to facilitate web browsing-related processes and functions; media processing instructions 466 to facilitate media processing-related processes and functions; GPS/Navigation instructions 468 to facilitate GPS and navigation-related processes and instructions; camera instructions 470 to facilitate camera-related processes and functions; accuracy data 472 and accuracy calculation instructions 474 to facilitate magnetometer calibration, as described in reference to FIG. 2. In some implementations, GUI instructions 456 and/or media processing instructions 466 implement the features and operations described in reference to FIGS. 1-4.

Memory 450 may also store other software instructions (not shown), such as web video instructions to facilitate web video-related processes and functions; and/or web shopping instructions to facilitate web shopping-related processes and functions. In some implementations, media processing instructions 466 are divided into audio processing instructions and video processing instructions to facilitate audio processing-related processes and functions and video processing-related processes and functions, respectively. An activation record and International Mobile Equipment Identity (IMEI) or similar hardware identifier can also be stored in memory 450.

Each of the above identified instructions and applications can correspond to a set of instructions for performing one or more functions described above. These instructions need not be implemented as separate software programs, procedures, or modules. Memory 450 can include additional instructions or fewer instructions. Furthermore, various functions of the mobile device may be implemented in hardware and/or in software, including in one or more signal processing and/or application specific integrated circuits.

Example Error Indicators

Figure 5A:
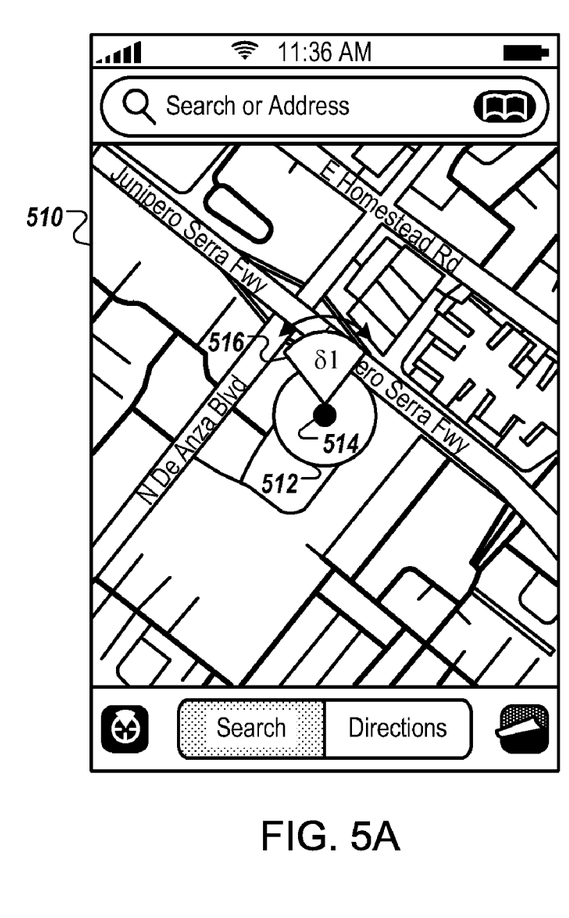
FIGS. 5A-5B are screenshots of a map user interface of a mobile device having a magnetometer, including a heading error indicator in accordance with some implementations.
Figure 5B:
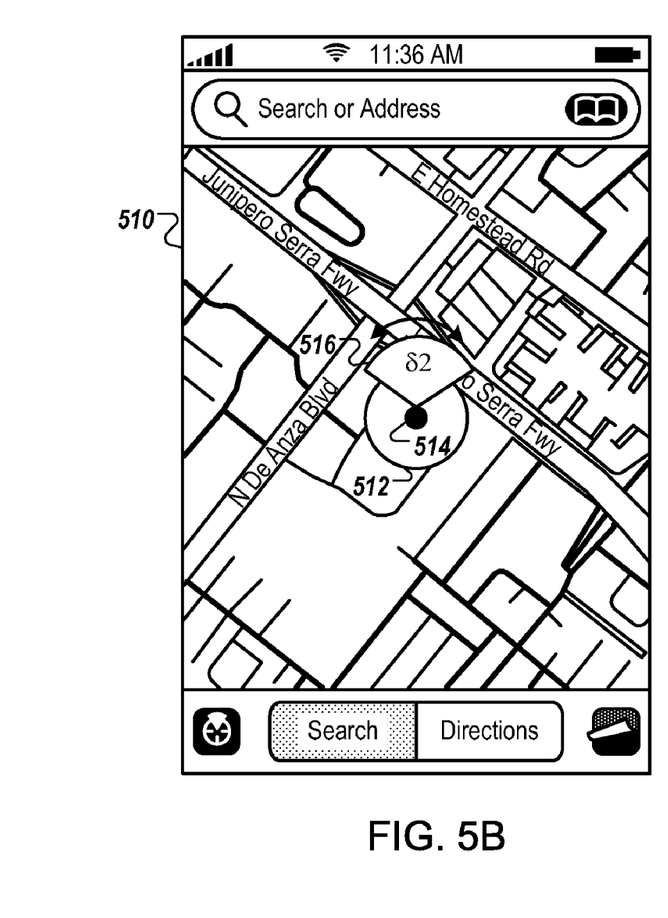

FIGS. 5A-5B are screenshots of a map user interface of a mobile device having a magnetometer, including a heading error indicator in accordance with some implementations. Referring to FIG. 5A, user interface 510 displays a portion of a map including heading error indicator 516. Marker 514 shows the location of the mobile device on the map. Position error indicator 512 surrounds marker 514 and indicates the position accuracy of the of the mobile device. The actual location of the mobile device is somewhere within indicator 512. Heading error indicator 516 indicates heading error. The actual heading is somewhere within the angle $\delta 1$.

Referring to FIG. 5B, heading error indicator 516 displayed in user interface 510 is indicating a larger heading error than displayed in FIG. 5B. That is the actual heading is somewhere within the angle $\delta 2$, where $\delta 1 < \delta 2$. The accuracy metric computed in equations (11) can be presented in other graphical forms or as test. In some implementations, an audio output (e.g., synthesized speech, beep) can be presented to the user.

The disclosed and other embodiments and the functional operations described in this specification can be implemented in digital electronic circuitry, or in computer software, firmware, or hardware, including the structures disclosed in this specification and their structural equivalents, or in combinations of one or more of them. The disclosed and other embodiments can be implemented as one or more computer program products, i.e., one or more modules of computer program instructions encoded on a computer-readable medium for execution by, or to control the operation of, data processing apparatus. The computer-readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, the disclosed embodiments can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The disclosed embodiments can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of what is disclosed here, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

While this specification contains many specifics, these should not be construed as limitations on the scope of what being claims or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understand as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A method performed by a processor of a mobile device having a magnetometer, the method comprising:
   determining a first instance of a parameter related to Earth's magnetic field using first data generated by the magnetometer, the first data based at least in part on a position of the mobile device with respect to the Earth;
   determining a second instance of the parameter using second data generated by a model of Earth's magnetic field, the second data based at least in part on the position of the mobile device with respect to the Earth;
   comparing the first instance of the parameter with the second instance of the parameter;
   determining an accuracy metric for the magnetometer based on results of the comparison; and
   presenting an indication of the accuracy metric on the mobile device.

2. The method of claim 1, where the first instance of a parameter is an angle between Earth's magnetic vector and Earth's gravitational acceleration vector defined in a Cartesian coordinate frame, and the second instance of the parameter is the angle provided by the model of Earth's magnetic field.

3. The method of claim 1, where comparing the first instance of the parameter with the second instance of the parameter includes computing a statistical value based on a difference between the first and second instances of the parameter.

4. The method of claim 1, where presenting an indication of the accuracy metric on the mobile device includes displaying a visual representation of the accuracy metric on a display of the mobile device.

5. The method of claim 4, where the visual representation includes a portion of a map that is marked to indicate a heading error associated with an orientation of the mobile device relative to the map.

6. An apparatus, comprising:
   a magnetometer; and
   a processor coupled to the magnetometer, the processor configured for:
   determining a first instance of a parameter related to Earth's magnetic field using first data generated by the magnetometer, the first data based at least in part on a position of the mobile device with respect to the Earth;
   determining a second instance of the parameter using second data generated by a model of Earth's magnetic field, the second data based at least in part on the position of the mobile device with respect to the Earth;
   comparing the first instance of the parameter with the second instance of the parameter;
   determining an accuracy metric for the magnetometer based on results of the comparison; and
   presenting an indication of the accuracy metric on the mobile device.

7. The apparatus of claim 6, where the first instance of a parameter is an angle between Earth's magnetic vector and Earth's gravitational acceleration vector defined in a Cartesian coordinate frame, and the second instance of the parameter is the angle provided by the model of Earth's magnetic field.

8. The apparatus of claim 6, where comparing the first instance of the parameter with the second instance of the parameter includes computing a statistical value based on a difference between the first and second instances of the parameter.

9. The apparatus of claim 6, where presenting an indication of the accuracy metric on the mobile device includes displaying a visual representation of the accuracy metric on a display of the mobile device.

10. The apparatus of claim 9, where the visual representation includes a portion of a map that is marked to indicate a heading error associated with an orientation of the mobile device relative to the map.

11. The apparatus of claim of claim 10, where the display is touch sensitive.

12. A computer-readable, non-transitory medium having instructions stored thereon, which, when executed by a processor, causes at least one processor to perform operations comprising:

determining a first instance of a parameter related to Earth's magnetic field using first data generated by the magnetometer, the first data based at least in part on a position of the mobile device with respect to the Earth;

determining a second instance of the parameter using second data generated by a model of Earth's magnetic field, the second data based at least in part on the position of the mobile device with respect to the Earth;

comparing the first instance of the parameter with the second instance of the parameter;

determining an accuracy metric for the magnetometer based on results of the comparison; and presenting an indication of the accuracy metric on the mobile device.

13. The computer-readable medium of claim 12, where the first instance of a parameter is an angle between Earth's magnetic vector and Earth's gravitational acceleration vector defined in a Cartesian coordinate frame, and the second instance of the parameter is the angle provided by the model of Earth's magnetic field.

14. The computer-readable medium of claim 12, where comparing the first instance of the parameter with the second instance of the parameter includes computing a statistical value based on a difference between the first and second instances of the parameter.

15. The computer-readable medium of claim 12, where presenting an indication of the accuracy metric on the mobile device includes displaying a visual representation of the accuracy metric on a display of the mobile device.

16. The computer-readable medium of claim 15, where the visual representation includes a portion of a map that is marked to indicate a heading error associated with an orientation of the mobile device relative to the map.

17. A method performed by a processor of a mobile device having a magnetometer, the method comprising:

determining an accuracy metric based on magnetometer measurements output by the magnetometer during a calibration or recalibration procedure; and presenting an indication of the accuracy metric on the mobile device.

18. The method of claim 17, where presenting an indication of the accuracy metric on the mobile device includes displaying a visual representation of the accuracy metric on a display of the mobile device.

19. The method of claim 18, where the visual representation includes a portion of a map that is marked to indicate a heading error associated with an orientation of the mobile device relative to the map.

20. The method of claim 18, where the visual representation indicates heading error.

21. The method of claim 18, where presenting an indication of the accuracy metric on the mobile device includes presenting an audio output to a user of the mobile device.

22. An apparatus, comprising:

a magnetometer; and a processor coupled to the magnetometer, the processor configured for:

determining an accuracy metric based on magnetometer measurements output by the magnetometer during a calibration or recalibration procedure; and presenting an indication of the accuracy metric on the mobile device.

23. The apparatus of claim 22, where presenting an indication of the accuracy metric on the mobile device includes displaying a visual representation of the accuracy metric on a display of the mobile device.

24. The apparatus of claim 23, where the visual representation includes a portion of a map that is marked to indicate a heading error associated with an orientation of the mobile device relative to the map.

25. The apparatus of claim 23, where the visual representation indicates heading error.

26. The apparatus of claim 22, where presenting an indication of the accuracy metric on the mobile device includes presenting an audio output to a user of the mobile device.

* * * * *

UNITED STATES PATENT AND TRADEMARK OFFICE
CERTIFICATE OF CORRECTION

PATENT NO. : 7,891,103 B2
APPLICATION NO. : 12/479717
DATED : February 22, 2011
INVENTOR(S) : Robert Mayor et al.

It is certified that error appears in the above-identified patent and that said Letters Patent is hereby corrected as shown below:

Title page 2, in column 1, under "Other Publications", line 9, delete ""Magenetic" and insert -- "Magnetic --, therefor.

Title page 2, in column 2, under "Other Publications", line 40, delete "Magnetomors,"" and insert -- Magnetometer," --, therefor.

In column 5, line 42, delete "$\Phi'=90°-1$." and insert -- $\Phi' = 90° - I'$. --, therefor.

In column 5, line 59-60, delete "$H_{fixed}$=F cos(I)." and insert -- $H_{fixed}$=Fcos(I). --, therefor.

In column 6, line 46-48, delete "//geomagneticModel, is an instance of the model that calculates all the static truth geomagnetic information fo the location of the device" and insert -- //geomagneticModel, is an instance of the model that calculates all the static truth geomagnetic information for the location of the device --, therefor.

In column 6, line 66, delete "fVaroamce." and insert -- fVariance. --, therefor.

In column 7, line 22, delete "accuracy=20.0f;" and insert -- accuracy=15.0f; --, therefor.

In column 7, line 23-24, above "} else if (val<kCompassAccuracyLevel3){" insert -- } else if (val<kCompassAccuracyLevel4){accuracy=20.0f; --.

In column 12, line 66, in claim 11, after "apparatus" delete "of claim".

Signed and Sealed this
Fifteenth Day of November, 2011

David J. Kappos
*Director of the United States Patent and Trademark Office*